United States Patent
Ono et al.

(10) Patent No.: US 6,657,246 B2
(45) Date of Patent: Dec. 2, 2003

(54) MRAM WITH AN EFFECTIVE NOISE COUNTERMEASURE

(75) Inventors: Hiroshi Ono, Yokohama (JP); Shigeyoshi Yoshida, Abiko (JP); Toshiaki Masumoto, Sendai (JP)

(73) Assignee: NEC Tokin Corporation, Sendai (JP)

( * ) Notice: Subject to any disclaimer, the term of this patent is extended or adjusted under 35 U.S.C. 154(b) by 0 days.

(21) Appl. No.: 09/927,974

(22) Filed: Aug. 10, 2001

(65) Prior Publication Data

US 2002/0020865 A1 Feb. 21, 2002

(30) Foreign Application Priority Data

Aug. 21, 2000 (JP) ......................................... 2000-249452

(51) Int. Cl.[7] ......................... H01L 27/108; H01L 29/76; H01L 29/94; H01L 31/119; H01L 43/00; H01L 23/552; H01L 23/495; H01L 23/02
(52) U.S. Cl. ...................... 257/296; 257/421; 257/660; 257/666; 257/678; 257/704; 257/710
(58) Field of Search ................. 257/659, 660, 257/665, 295, 296, 421, 666, 678, 710, 704

(56) References Cited

U.S. PATENT DOCUMENTS

| 5,559,306 A | * | 9/1996 | Mahulikar | 174/52.4 |
|---|---|---|---|---|
| 5,741,435 A | * | 4/1998 | Beetz, Jr. et al. | 252/62.55 |
| 5,821,628 A | * | 10/1998 | Hotta | 257/738 |
| 5,902,690 A | | 5/1999 | Tracy et al. | |
| 6,001,272 A | * | 12/1999 | Ikuma et al. | 252/62.54 |
| 2001/0037897 A1 | * | 11/2001 | Awakura et al. | 174/256 |
| 2001/0038926 A1 | * | 11/2001 | Awakura et al. | 428/692 |

FOREIGN PATENT DOCUMENTS

| EP | 0 667 643 A | | 8/1995 | |
|---|---|---|---|---|
| EP | 0 785 557 | * | 7/1996 | ....... 1/37 |
| EP | 0 785 557 A | | 7/1997 | |
| JP | 10-307902 A | | 11/1998 | |

* cited by examiner

*Primary Examiner*—Nathan J. Flynn
*Assistant Examiner*—Victor A. Mandala, Jr.
(74) *Attorney, Agent, or Firm*—Frishauf, Holtz, Goodman & Chick, P.C.

(57) ABSTRACT

In a magnetic random access memory having a memory device portion (33,34,35) using magnetic material, a high-frequency current suppressor (26) is arranged in the vicinity of the magnetic material to suppress a high-frequency current which flows in the memory device portion. The memory device and the high-frequency current suppressor may be collectively molded in a mold body (25) of a plastic resin. It is preferable that the high-frequency current suppressor is made of a thin film of a granular magnetic material which has a composition represented by M-X-Y where M is a magnetic metal element, Y is one element selected from oxygen, nitrogen, and fluorine, and X is an element other than M and Y.

4 Claims, 5 Drawing Sheets

US 6,657,246 B2

MRAM WITH AN EFFECTIVE NOISE COUNTERMEASURE

BACKGROUND OF THE INVENTION

This invention relates to a memory device and, in particular, to a magnetic random access memory (hereinafter abbreviated to MRAM) using a nonvolatile magnetic memory cell.

At present, development of an MRAM is making rapid progress as a large-capacity memory device capable of carrying out high-speed reading and writing operations. As the MRAM, use is predominantly made of a structure comprising a number of memory cells and utilizing so-called tunnel junction. The tunnel junction makes use of the fact that an electric resistance between two magnetic layers with a nonmagnetic film interposed therebetween is different depending upon whether spins known in the art are parallel or anti-parallel to each other between the magnetic layers. The MRAM of the type includes a transistor for selecting a specific memory cell to be accessed.

Referring to FIG. 1, description will be made of an existing MRAM. The MRAM illustrated in FIG. 1 comprises a substrate 1 and an integrated device portion 2 mounted on the substrate 1. The integrated device portion 2 is connected through lead wires 3 to lead terminals 4. The substrate 1, the integrated device portion 2, the lead wires 3, and the lead terminals 4 are molded by a resin mold 5.

The integrated device portion 2 includes a number of transistor portions and a number of memory device portions. Each of the memory device portions serves as a memory cell. Each of the transistor portions serves to select a particular memory cell.

Referring to FIG. 2, description will be made of the structure of the integrated device portion 2. The integrated device portion 2 comprises a first conductor 11 on the substrate 1, a first insulator layer 12 on the first conductor 11, a first ferromagnetic member or layer 13 on the first insulator layer 12, a second insulator layer 14 covering the first ferromagnetic member 13, a second ferromagnetic member 15 on the second insulator layer 14, a third insulator layer 16 covering the second ferromagnetic member 15, and a fourth insulator layer 17 and a second conductor 18 both of which are formed on the third insulator layer 16. A combination of the first ferromagnetic member 13, the second insulator layer 14, and the second ferromagnetic member 15 forms a magnetic tunnel function device as one of the memory device portions.

Each of the first and the second conductors 11 and 18 is arranged so that the second ferromagnetic member 15 is applied with a magnetic field when an electric current is supplied thereto. In case where both of the first and the second conductors 11 and 18 are supplied with electric currents, magnetic fields are produced by the electric currents and combined into a composite magnetic field. Under the composite magnetic field, magnetization of the second ferromagnetic member 15 is rotated and reversed. On the other hand, the first ferromagnetic member 13 is fixed in magnetization, for example, by the use a ferromagnetic material having high saturation magnetization.

The first ferromagnetic member 13 is made of a CoPt alloy while the second ferromagnetic member 15 is made of a NiFe alloy. The second insulator layer 14 is made of $Al_2O_3$ or the like.

In the meanwhile, highly-integrated semiconductor devices capable of carrying out high-speed operations include not only the MRAM but also a dynamic random access memory (DRAM), a read-only memory (ROM), a microprocessor unit (MPU), and an image processor arithmetic logic unit (IPALU), and so on. Recently, these devices are remarkably increased in calculation speed and signal processing speed. Such increase in calculation speed and signal processing speed results in drastic or quick change in electric current flowing in these devices. The quick change in electric current is a major factor causing high-frequency inductive noise.

On the other hand, reduction in weight, thickness, and size of electronic components and electronic apparatuses is making rapid progress also. Therefore, the degree of integration of the semiconductor device as an electronic component and the density of mounting the same on a printed wiring board are increased. As a consequence, if the electronic component is highly integrated or the electronic components are mounted at a high density, signal lines are very close to each other. In combination with the above-mentioned increase in signal processing speed, high-frequency radiation noise is readily induced.

In the above-mentioned electronic circuit, an attempt to suppress the noise has been made by optimizing the design in arrangement of components on the printed wiring board and wiring therebetween or by inserting a lumped-constant component such as a decoupling capacitor into a power supply line.

However, in the semiconductor device or the printed wiring board increased in operation speed, the noise generated therefrom contains harmonics components so that the behavior of a signal path is similar to that of a distributed-constant circuit. In this event, the existing noise countermeasure assuming a lumped-constant circuit is no longer effective. In addition, limitation is imposed upon reduction of the noise by optimizing the arrangement of the electronic parts and the wiring.

In the operation of the above-mentioned MRAM, harmonic distortion produced upon high-speed change in electric current is a major factor causing the high-frequency radiation noise, like other types of semiconductor random access memories (RAM). On the other hand, the noise superposed on a writing current or a magnetic layer causes the fluctuation in magnitude of magnetization of the magnetic layer. As a result, an additional operation will be required upon writing. If the noise is mixed in a signal upon reading, an additional process such as repetition of a reading operation is required. In other words, if the noise countermeasure is not effective, substantial writing and reading speeds are decreased upon writing and reading data. Therefore, in the operation of the MRAM, it is important not only to prevent the noise from being propagated to other components or portions but also to prevent reduction in substantial writing and reading speeds due to the noise.

SUMMARY OF THE INVENTION

It is therefore an object of this invention to provide a large-capacity non-volatile memory which is suppressed in generation of noise and is excellent in noise resistance so as to carry out writing and reading operations at a substantially high speed.

Other objects of the present invention will become clear as the description proceeds.

The present inventors have already invented a composite magnetic material having a high magnetic loss at a high frequency and found out a method of effectively suppressing extraneous emission or unnecessary radiation produced from a semiconductor device or an electronic circuit by arranging the composite magnetic material in the vicinity of an extraneous emission source. From the recent research, it has been found out that the effect of attenuating the extraneous emission utilizing the magnetic loss is based on a mechanism in which an equivalent resistance component is added to the electronic circuit as the extraneous emission source. Herein, the magnitude of the equivalent resistance component depends upon the magnitude of a magnetic loss term $\mu''$ of a magnetic material. Specifically, the magnitude of the resistance component equivalently inserted into the electronic circuit is substantially proportional to $\mu''$ and the thickness of the magnetic material as far as the area of the magnetic material is fixed. It is noted here that the magnetic loss term $\mu''$ is an imaginary part of the relative permeability of the magnetic material. Therefore, in order to achieve a desired level of attenuation of the extraneous emission by the use of a smaller or a thinner magnetic material, the value of $\mu''$ must be greater. For example, in order to prevent the extraneous emission utilizing a magnetic loss material in a very small region such as an interior of a mold of the semiconductor device, the magnetic loss term $\mu''$ must have a very large value.

During the research of a soft magnetic material produced by sputtering or vapor deposition, the present inventors have focused upon excellent permeability characteristics of a granular magnetic material uniformly distributed with fine magnetic metal particles or granules in a nonmagnetic material such as ceramics. As a result of investigating a fine structure of the magnetic metal particles surrounded by a nonmagnetic material, the present inventors have found out that, in case where the ratio of the magnetic metal particles in the granular magnetic material fall within a specific range, excellent magnetic loss characteristics are achieved in a high-frequency band.

It is noted here that a granular magnetic thin film is a magnetic thin film in which magnetic particles have a size as small as several nanometers to several tens nanometers and each particle has a fine structure bounded by a grain boundary comprising a ceramics component and which exhibits a very large magnetic loss in a high-frequency band between several tens MHz to several GHz. The granular magnetic thin film may be called a fine crystal thin film.

As regards the granular magnetic material having a composition represented by M-X-Y (M being a magnetic metal element, Y being one element selected from oxygen, nitrogen, and fluorine, X being an element other than M and Y), a number of researches have been made so far. It is revealed that the granular magnetic material has a low magnetic loss and a great saturation magnetization. In order to achieve a greater saturation magnetization in the M-X-Y granular magnetic material, it is necessary to increase the ratio of the component M. Therefore, in general applications such as a high-frequency inductor device or a magnetic core of a transformer, the ratio of the component M in the M-X-Y granular magnetic material is limited to a range such that the saturation magnetization is equal to about 80% or more of the saturation magnetization of a bulk metal magnetic material comprising the component M alone.

The present inventors investigated over a wide range of the ratio of the component M in the granular magnetic material having a composition represented by M-X-Y (M being a magnetic metal element, Y being one element selected from oxygen, nitrogen, and fluorine, X being an element other than M and Y). As a result, it has been found out that, in any composition system, a large magnetic loss is exhibited in a high-frequency band if the concentration of the magnetic metal M falls within a specific range.

A highest region of the ratio of the component M is such that the saturation magnetization is 80% or more of the saturation magnetization of a bulk metal magnetic material comprising the component M alone. This region corresponds to the M-X-Y granular magnetic material which has high saturation magnetization and low loss and which has been actively researched and developed. Those materials within the above-mentioned region are large in both of real part permeability $\mu'$ and saturation magnetization and are therefore used in high-frequency micromagnetic devices such as the above-mentioned high-frequency inductor. However, the ratio of each of the components X and Y determining electric resistance is small so that the electric resistance is small. Therefore, if the thickness of the film is increased, the permeability at the high-frequency is degraded following occurrence of eddy current loss at the high-frequency band. Thus, these materials are inappropriate as a magnetic film for a noise countermeasure.

A next region of the ratio of the component M is such that the saturation magnetization is not greater than 80% and not smaller than 60% of the saturation magnetization of the bulk metal magnetic material comprising the component M alone. In this region, the electric resistance is equal to about 100 $\mu\Omega$·cm which is relatively large. Therefore, even if the thickness of the material is on the order or several $\mu$m, the eddy current loss is small and most of the magnetic loss results from natural resonance. As a consequence, the magnetic loss term $\mu''$ has a narrow width of frequency distribution. Thus, this region is appropriate for the noise countermeasure (high-frequency current suppression) in a narrow frequency band.

A third region of the ratio of the component M is such that the saturation magnetization is not greater than 60% and not smaller than 35% of the saturation magnetization of the bulk metal magnetic material comprising the component M alone. In this region, the electric resistance is equal to about 500 $\mu\Omega$·cm which is greater than that mentioned above. Therefore, the eddy current loss is extremely small and magnetic interaction between particles of the component M is small. Therefore, thermal disturbance of the spin is increased and the frequency causing the natural resonance is fluctuated. As a result, the magnetic loss term $\mu''$ exhibits a large value over a wide frequency band. Thus, this region of the ratio is appropriate for suppression of the high-frequency current over a wide band.

On the other hand, a region of a smaller ratio of the component M provides ultramagnetic characteristic because no substantial magnetic interaction between the particles of the component M is caused to occur.

In case where the magnetic loss material is arranged in the vicinity of a noise radiating portion to suppress the high-frequency current, the standard of material design is given by a product $\mu''\cdot\delta$ of the magnetic loss term $\mu''$ and the thickness $\delta$ of the magnetic loss material. In order to achieve effective suppression of the high-frequency current of several hundreds MHz, the following relationship must be satisfied:

$\mu''\cdot\delta \geq$ about 1000 ($\mu$m)

Specifically, if the magnetic loss material has a magnetic loss term $\mu''$=1000, the thickness must be equal to 1 $\mu$m or more. Those material having a low electric resistance and easy to cause eddy current is not preferable. The composition such that the electric resistance is 100 $\mu\Omega$·cm or more is preferable. In the composition system used in this invention, it is preferable that the ratio of the component M falls within the region such that the saturation magnetization is not greater than 80% and not smaller than 35% of the saturation magnetization of the bulk metal magnetic material comprising the component M alone. The region such that the saturation magnetization is equal to 35% or more of the saturation is a region where no ultramagnetism is exhibited.

The present inventors have made this invention by applying the above-mentioned magnetic material to the MRAM.

According to the present invention, there is provided a magnetic random access memory which comprises a memory device portion using magnetic material and a high-frequency current suppressor arranged in the vicinity of the magnetic material for suppressing a high-frequency current which flows in the memory device portion.

BRIEF DESCRIPTION OF THE INVENTION

DESCRIPTION OF THE PREFERRED EMBODIMENTS

At first referring to FIG. 3, description will be made as regards an MRAM according to a first embodiment of this invention.

Figure 1:
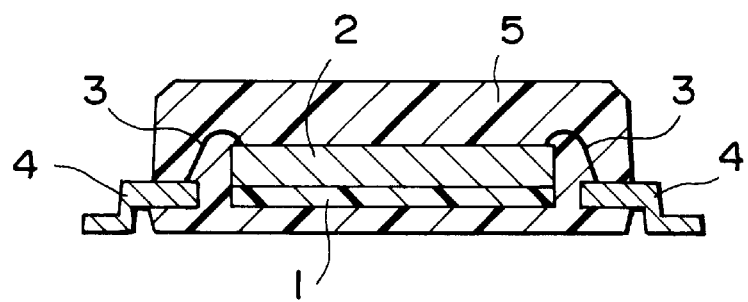
FIG. 1 is a sectional view of an MRAM in a related technique.
Figure 2:
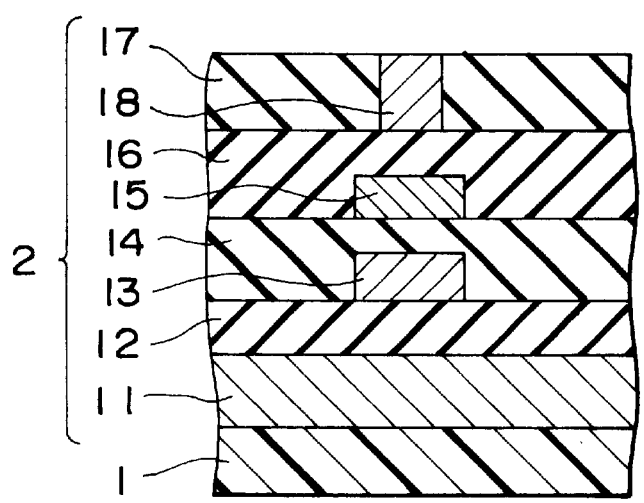
FIG. 2 is an enlarged sectional view of a characteristic part of the MRAM illustrated in FIG. 1.
Figure 3:
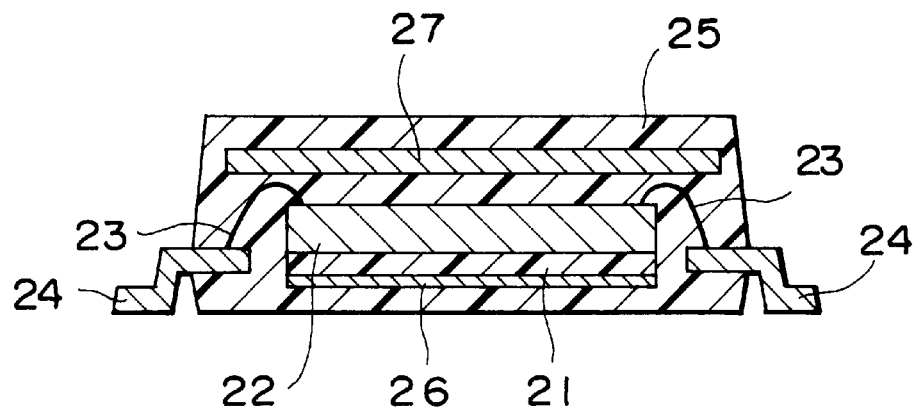
FIG. 3 is a sectional view of an MRAM according to a first embodiment of this invention.

The MRAM illustrated in FIG. 3 comprises a substrate 21 and an integrated device portion 22 mounted on the substrate 21. The integrated device portion 22 is connected through lead wires 23 to lead terminals 24. The substrate 21, the integrated device portion 22, the lead wires 23, and the lead terminals 24 are collectively molded in mold body 25 made of a plastic resin. Upon molding, a high-frequency current suppressor 26 is arranged on a lower surface of the substrate 21. Another high-frequency current suppressor 27 is arranged above the integrated device portion 22 with a space kept therefrom. The high-frequency current suppressors 26 and 27 will later be described in detail.

The integrated device portion 22 has a number of memory device portions which will later become clear. Each of the memory device portions serves as a memory cell. The integrated device portion 22 has a transistor portion (not shown) arranged between each memory device portion and the substrate 21 to select a particular memory cell.

Figure 4:
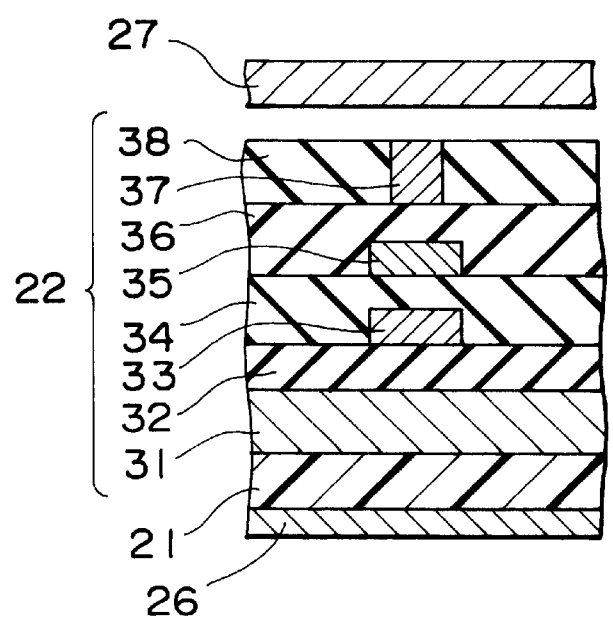
FIG. 4 is an enlarged sectional view of a characteristic part of the MRAM illustrated in FIG. 3.

Referring to FIG. 4, description will be made as regards the structure of the integrated device portion 22. The integrated device portion 22 comprises a first conductor 31 on the substrate 21, a first insulator layer 32 on the first conductor 31, a first ferromagnetic member 33 on the first insulator layer 32, a second insulator layer 34 covering the first ferromagnetic member 33, a second ferromagnetic member 35 on the second insulator layer 34, a third insulator layer 36 covering the second ferromagnetic member 35, and a fourth insulator layer 38 and a second conductor 37 both of which are formed on the third insulator layer 36. A combination of the first ferromagnetic member 33, the second insulator layer 34, and the second ferromagnetic member 35 forms a magnetic tunnel function device as one of the above-mentioned memory device portions.

Each of the first and the second conductors 31 and 37 is arranged so that the second ferromagnetic member 35 is applied with a magnetic field when an electric current is supplied thereto. In case where both of the first and the second conductors 31 and 37 are supplied with electric currents, magnetic fields are produced by the electric currents and combined into a composite magnetic field. Under the composite magnetic field, magnetization of the second ferromagnetic member 35 is rotated and reversed. On the other hand, the first ferromagnetic member 33 is fixed in magnetization, for example, by the use a ferromagnetic material having high saturation magnetization.

The first ferromagnetic member 33 is made of a CoPt alloy while the second ferromagnetic member 35 is made of a NiFe alloy. The second insulator layer 34 is made of $Al_2O_3$ or the like.

Each of the first and the second high-frequency current suppressors 26 and 27 serves to suppress harmonic distortion of a pulse current flowing through the first or the second conductor 31 or 37, to suppress high-frequency radiation noise, and to prevent the noise from being superposed upon a reading current flowing between the first and the second ferromagnetic members 33 and 35.

Next, the description will be directed to formation of the high-frequency current suppressors 26 and 27. Each of the high-frequency current suppressors 26 and 27 comprises a granular magnetic thin film containing Fe, Al, and O.

In a vacuum chamber equipped with an oxygen gas supplier, a film was deposited on a polyimide plate by vapor deposition using a $Fe_{70}Al_{30}$ alloy as a deposition material. The vacuum degree before deposition was $1.33 \times 10^{-4}$ Pa or less. The oxygen gas flow rate during deposition was $18.0 \cdot 10^{-5}$ m$^3$/hr. After the vapor deposition, heat treatment was carried out in a vacuum magnetic field for two hours at 300° C. Thus, the granular magnetic thin film was obtained.

The thin film had a thickness of 2.0 $\mu$m, a d.c. resistance of 530 $\mu\Omega \cdot$cm, anisotropic magnetic field $H_k$ of 18 Oe (1422 A/m), saturation magnetization Ms of 16800 Gauss (1.68 T), and a relative bandwidth bwr of 148%. The relative bandwidth bwr is obtained by extracting a frequency bandwidth between two frequencies at which the value of $\mu''$ is 50% of the maximum $\mu''_{max}$ and normalizing the frequency bandwidth at the center frequency thereof. The saturation magnetization of the thin film was 72.2% of the saturation magnetization of a bulk material comprising a magnetic metal alone.

Figure 5:
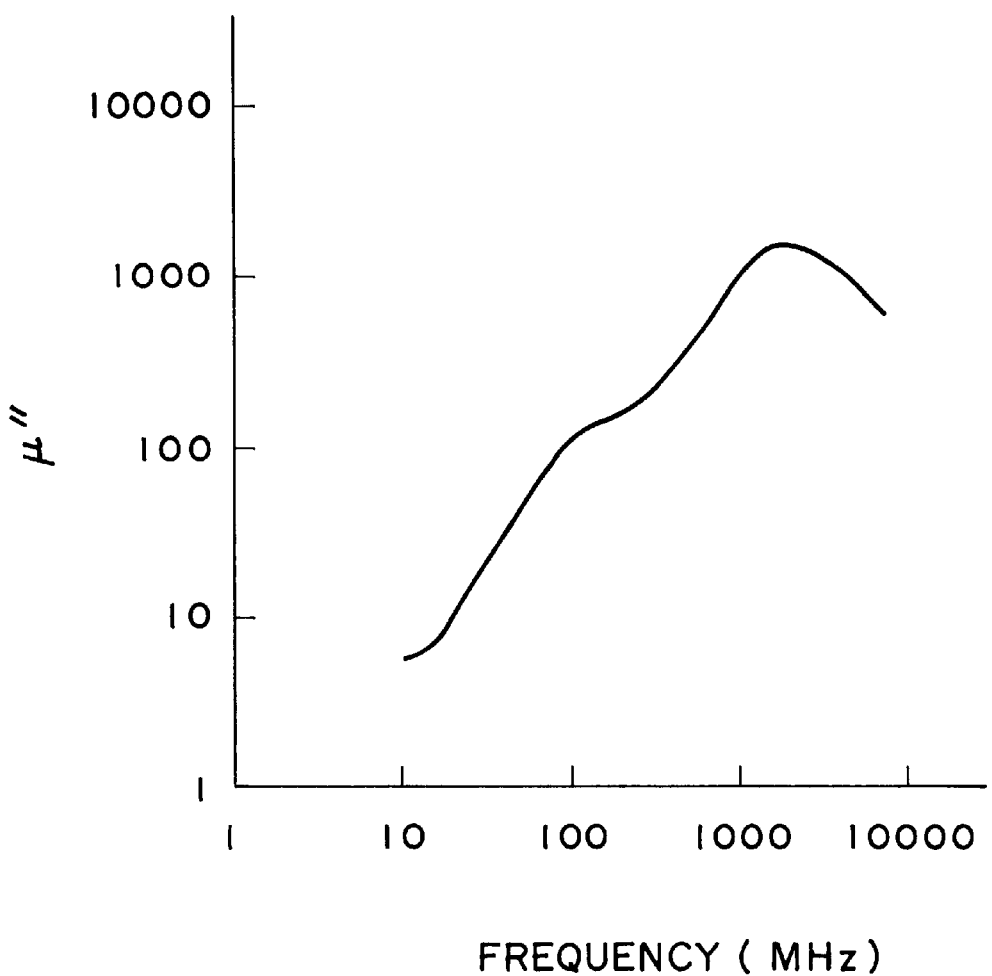
FIG. 5 is a graph showing a frequency characteristic of a magnetic loss term $\mu''$ of a granular magnetic material.

Referring to FIG. 5, the magnetic loss term $\mu''$ has a frequency characteristic illustrated in the figure. The abscissa and the ordinate represent the frequency and the magnetic loss term which is the imaginary part $\mu''$ of the complex permeability.

Figure 6:
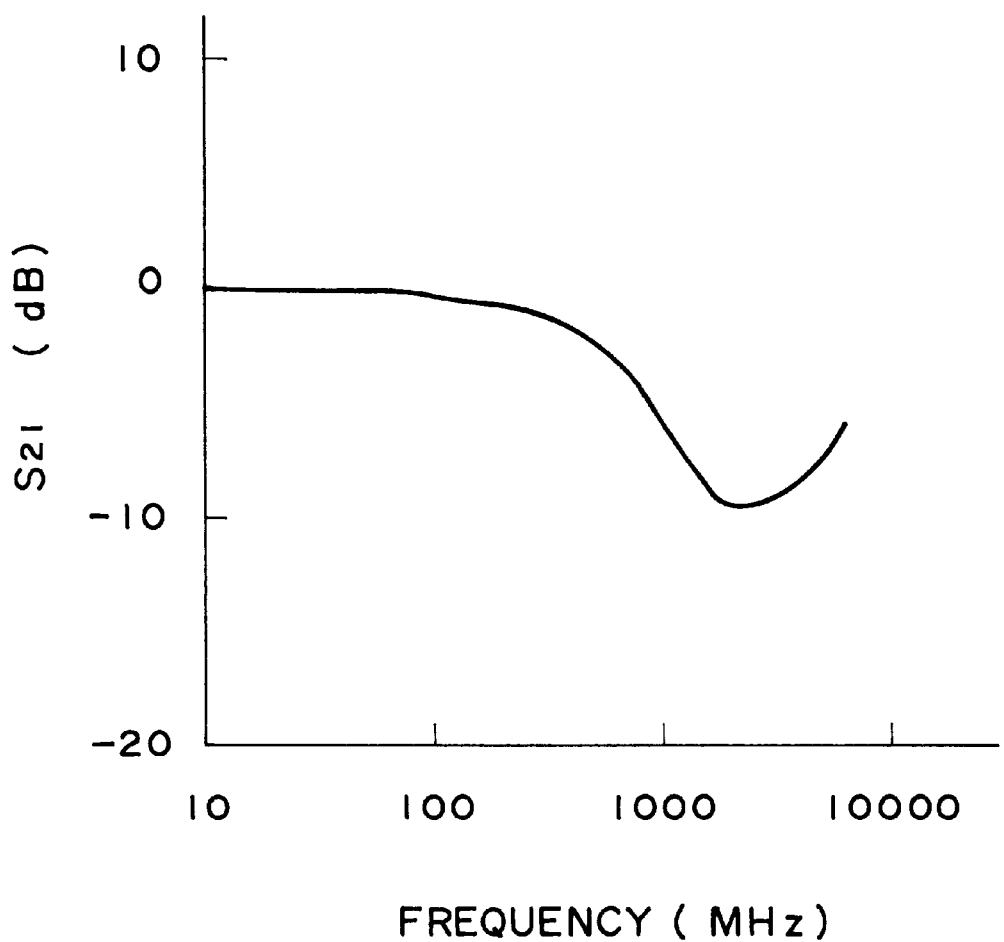
FIG. 6 is a graph showing a frequency characteristic of a transmission characteristic $S_{21}$ in a microstrip line with a granular magnetic thin film arranged in the vicinity.

Investigation was made of the high-frequency current suppressing effect of the thin film thus obtained. Specifically, the thin film was placed directly on a microstrip line having a length of 75 mm and a characteristic impedance of 50 $\Omega$. By the use of a network analyzer, transmission characteristic was measured. The result of measurement is shown in FIG. 6. By the use of the granular magnetic thin film, the $S_{21}$ transmission characteristic was monotonously reduced from the frequency around 100 MHz and exhibited −10 dB at about 3 GHz. The result shows that the $S_{21}$ transmission characteristic depends upon the distribution of $\mu''$ and that the level of the suppression effect depends upon the product of $\mu''$ and the thickness $\delta$.

In the foregoing, the formation of the film by the vacuum vapor deposition is described. Alternatively, use may be made of sputtering, ion beam deposition, and gas deposition. As far as the magnetic loss material is uniformly deposited, no limitation is imposed upon the technique of forming the thin film.

Figure 7:
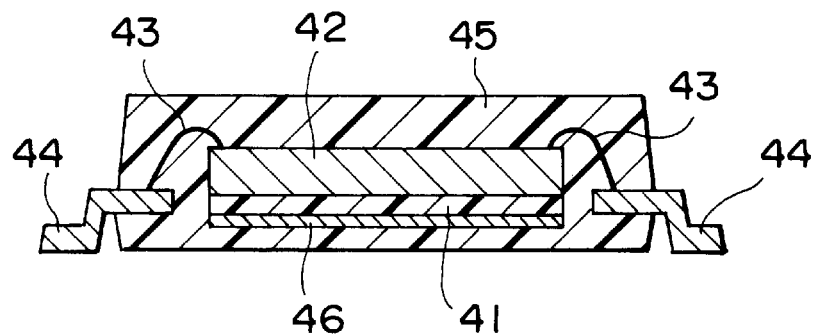
FIG. 7 is a sectional view of an MRAM according to a second embodiment of this invention.

Referring to FIG. 7, the description will be made as regards an MRAM according to a second embodiment of this invention.

The MRAM illustrated in FIG. 7 comprises a substrate 41 and an integrated device portion 42 mounted on the substrate 41. The integrated device portion 42 is connected through lead wires 43 to lead terminals 44. The substrate 41, the integrated device portion 42, the lead wires 43, and the lead terminals 44 are molded by a resin mold 45. Upon molding, a high-frequency current suppressor 46 is arranged on a lower surface of the substrate 41. The integrated device portion 42 is similar in structure to the integrated device portion 22 illustrated in FIG. 4.

The high-frequency current suppressor 46 comprises a thin film of a granular magnetic material. The thin film can be formed in a manner substantially similar to that of the high-frequency current suppressor 26 in the MRAM described in conjunction with FIGS. 3 and 4. Preferably, the thin film is made of a material and has a composition such that no heat treatment is required after deposition by vapor deposition or the like.

Figure 8:
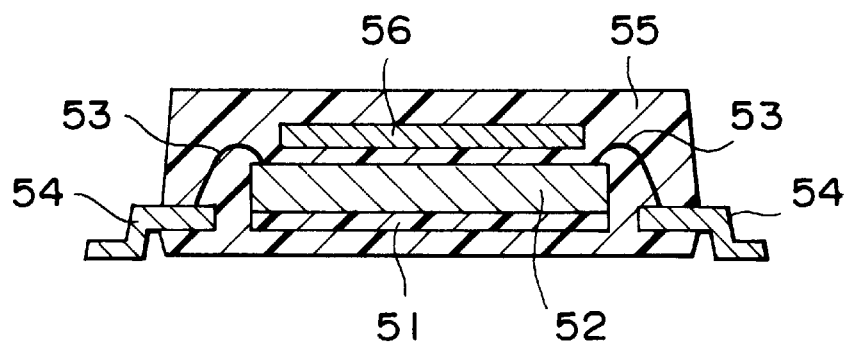
FIG. 8 is a sectional view of an MRAM according to a third embodiment of this invention.

Referring to FIG. 8, the description will be made as regards an MRAM according to a third embodiment of this invention.

The MRAM illustrated in FIG. 8 comprises a substrate 51 and an integrated device portion 52 mounted on the substrate 51. The integrated device portion 52 is connected through lead wires 53 to lead terminals 54. The substrate 51, the integrated device portion 52, the lead wires 53, and the lead terminals 54 are molded by a resin mold 55. Upon molding, a high-frequency current suppressor 56 is arranged above the integrated device portion 52 with a space kept therefrom.

The integrated device portion 52 is similar in structure to the integrated device portion 22 illustrated in FIG. 4. The high-frequency current suppressor 56 comprises a thin film of a granular magnetic material. For example, the thin film can be formed on a polyimide plate in a manner substantially similar to that of the high-frequency current suppressor 27 in the MRAM described in conjunction with FIGS. 3 and 4. The high-frequency current suppressor 56 thus obtained is arranged above the integrated device portion 52 by molding with the resin mold 55 such as polyimide.

In any one of the MRAMs described above, harmonic distortion of a signal pulse current is decreased and undesired emission or radiation can be reduced. Therefore, it is possible to avoid substantial decrease in data writing speed and in data reading speed.

What is claimed is:

1. A magnetic random access memory comprising:
   a memory device portion using magnetic material; and
   at least one high-frequency current suppressor arranged in the vicinity of said magnetic material for suppressing a high-frequency current which unfavorably flows in said memory device portion;
   wherein said high-frequency current suppressor comprises a thin film of a magnetic material having:
   a composition represented by M-X-Y where M is a magnetic metal element, Y is one element selected from oxygen, nitrogen, and fluorine, and X is an element other than M and Y;
   a saturation magnetization corresponding to at least 35% of a saturation magnetization of a bulk material comprising M alone; and
   an electric resistance of about 100 $\mu\Omega$·cm or more.

2. The magnetic random access memory according to claim 1, further comprising a mold body in which said memory device portion and said high-frequency current suppressor are molded.

3. The magnetic random access memory according to claim 1, wherein said magnetic material is granular magnetic material.

4. The magnetic random access memory according to claim 1, wherein said magnetic material has a thickness $\delta$ and a magnetic loss term $\mu''$, and $\mu'' \cdot \delta \geq$ about 1000 ($\mu$m).

* * * * *